United States Patent [19]

Hess

[11] 3,906,214

[45] Sept. 16, 1975

[54] SIGNAL RETAINING ANALOG INTEGRATOR APPARATUS

[75] Inventor: Richard F. Hess, Phoenix, Ariz.

[73] Assignee: The United States of America as represented by the Secretary of the Air Force, Washington, D.C.

[22] Filed: Nov. 29, 1973

[21] Appl. No.: 420,331

[52] U.S. Cl. ................ 235/183; 307/229; 328/127; 328/151; 330/110

[51] Int. Cl. ................ G06g 7/18

[58] Field of Search ............ 235/183; 328/127, 150, 328/151; 307/237, 318, 229; 330/110

[56] References Cited

UNITED STATES PATENTS

| | | | |
|---|---|---|---|
| 3,436,672 | 4/1969 | Delagrange | 307/318 |
| 3,541,462 | 11/1970 | Sarkisian et al. | 330/110 |
| 3,617,725 | 11/1971 | Smith | 235/183 |
| 3,619,584 | 11/1971 | Gilbert et al. | 235/183 |
| 3,636,458 | 1/1972 | Sugiyama | 328/127 |
| 3,736,528 | 5/1973 | Acker et al. | 328/127 |
| 3,764,922 | 10/1973 | Gilbert et al. | 328/127 |

*Primary Examiner*—Felix D. Gruber
*Attorney, Agent, or Firm*—Joseph E. Rusz; William Stepanishen

[57] ABSTRACT

An signal retaining analog integrator apparatus having the capability of maintaining the reference voltage required for precision integrate and or signal retaining functions in the event of a power failure. The analog integrator and hold apparatus provides precise operation after being subject to a severe radiation environment.

8 Claims, 2 Drawing Figures

SIGNAL RETAINING ANALOG INTEGRATOR APPARATUS

BACKGROUND OF THE INVENTION

The present invention relates broadly to an analog integrator and hold circuit and in particular signal retaining integrator circuit having the capability of maintaining precision operation after either a power failure or exposure to damaging radiation levels.

The effect of radiation in semiconductor devices is to generate hole electron pairs in the semiconductor material. The carriers which move by diffusion and drift to the junctions produce transient photocurrents. The current components which enter the base region are called the primary photocurrents. The major component of primary photocurrent is that produced in the collector region and the transition region of the collector base junction. The emitter component of primary photocurrent is normally much smaller due to the short diffusion length in the emitter. The primary photocurrent entering the base region produces an amplified component of current called the secondary photocurrent. The magnitude of the transient photocurrents increases with ionizing rate. For high radiation rates, the currents may be of sufficient magnitude to produce error signals in a circuit or render it inoperative. There also exists a need in the art for electrical circuits which are capable of maintaining initial or reference conditions in the event of the power loss. The present circuit provides the dual capability of precise operation after exposure to a severe radiation environment, and the capability of maintaining reference voltage within the unit during the power failure.

SUMMARY OF THE INVENTION

The present invention utilizes a high input impedance operational amplifier with a capacitor in the feedback to provide an signal retaining analog integration apparatus. A matched dual pair MOSFET which is supplied by a precision current source is utilized as a differential amplifier whose outputs are connected to the operational amplifier to provide a high input impedance operational amplifier. A limiter circuit is placed around the operational amplifier in order to prevent the storing of twice the power supply voltage on the feedback capacitor. The operation of the limiter is such that it does not degrade circuit performance in the hold or signal retaining mode.

It is one object of the invention, therefore, to provide an improved signal retaining analog integrator apparatus having the capability of maintaining the reference voltage across the feedback capacitor in the event of a power failure.

It is another object of the invention to provide an signal retaining improved analog integrator apparatus having the capability for precise circuit operation after exposure to a severe radiation environment.

It is yet another object of the invention to provide an signal retaining improved analog integrator apparatus having the capability of maintaining the initial hold condition for a predetermined length of time, and having a low offset voltage over a predetermined temperature range.

These and other advantages, features and objects of the invention will become more apparent from the following description taken in connection with the illustrative embodiment in the accompanying drawing.

DESCRIPTION OF THE PREFERRED EMBODIMENT

Figure 1:
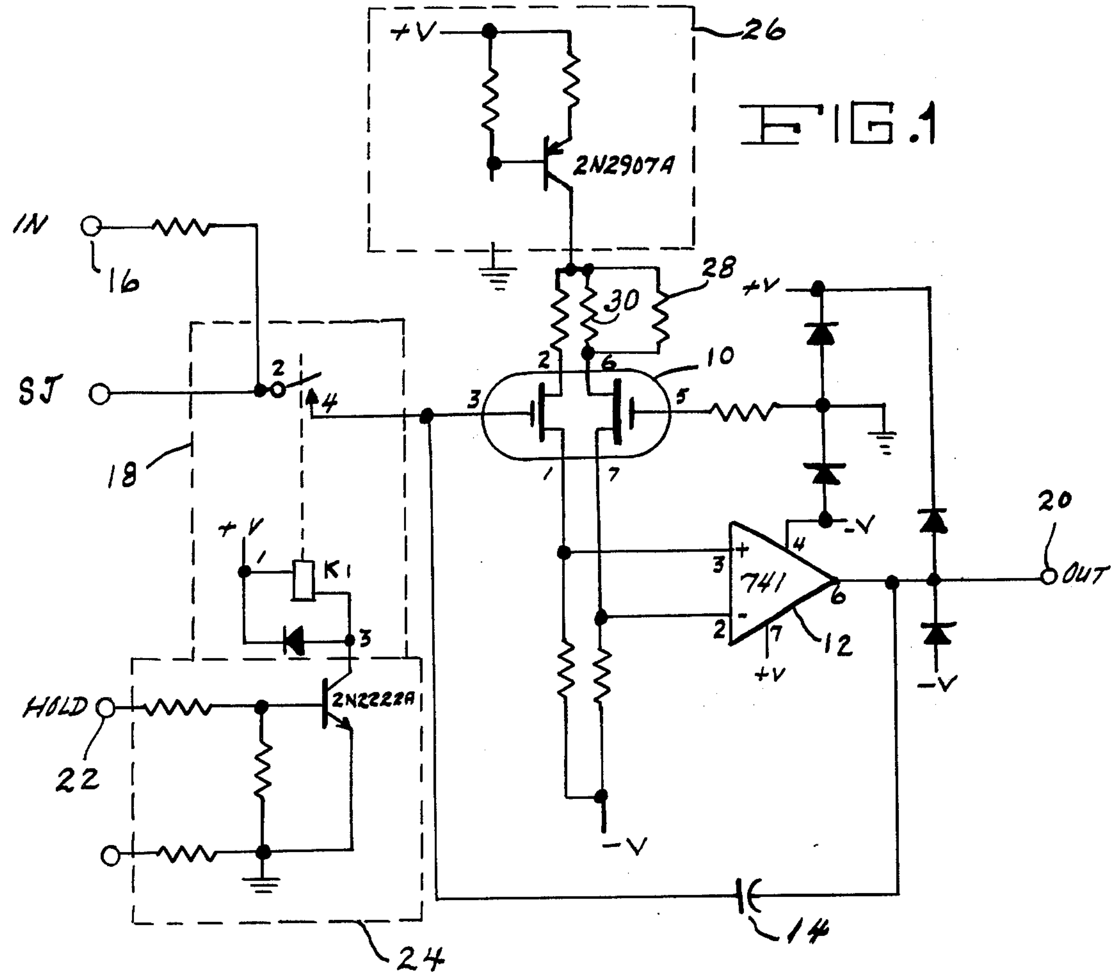
FIG. 1 is a schematic diagram of the signal retaining analog integrator apparatus in accordance with the present invention.

Referring now to FIG. 1, there is shown an signal retaining integrator apparatus having a MOSFET 10 connected to an operational amplifier 12. The operational amplifier 12 has a capacitor 14 which is connected from its output terminal 6 to the input terminal 3 of the MOSFET 10. In this configuration, the circuit performs the integrator function. The input signal is applied to terminal 16 and passes through the closed relay contact arm 2 through contact 4 of the relay to the input terminal 3 of the MOSFET 10. Thus, when the relay coil K1 of relay assembly 18 is closed, the input signal is applied to the integrator which comprises MOSFET 10 and operational amplifier 12. The output of the integrator circuit appears at output terminal 20. The MOSFET 10 is a tightly matched dual MOSFET pair having gate regions of pure silicon dioxide, $SiO_2$. Mosfets which are suitable for use in the present circuit are available commercially from Hughes under the manufacturing designation of HDIG 8551 or LDIG 9551. The operational amplifier 12 is a general purpose integrator circuit operational amplifier which is commercially available from Fairchild under manufacturing designation of UA741.

The MOSFET 10 is a dual match pair device which is biased so that the gate is biased negative with respect to the source, ie $V_{GS}$ is negative. The gates, pins 3 and 5 of MOSFET 10, are biased negative relative to pins 2 and 6 respectively of MOSFET 10. The more negative a gate is biased relative to the source, the more that channel conducts. The MOSFET 10 is operated as a differential amplifier whose output is connected to a conventional operational amplifier, pins 2 and 3 of opererational amplifier 12. The combination of the MOSFET 10 and the operational amplifier 12 results in a high input impedance operation amplifier (HIIOA).

The hold or signal retaining function of the signal retaining analog integrator apparatus is provided by applying the hold signal to terminal 22 of signal control unit 24. When a hold signal is applied to terminal 22, relay arm 2 is disengaged from contact 4 of relay unit 18. Thus the input signal to the analog integrator comprising MOSFET 10, operational amplifier 12 and capacitor 14 is interrupted; the amplifier output voltage remains stored across capacitor 14. The capacitor 14 is a low leakage, long storage time capacitor. The storage time of capacitor 14 is in the order of $10^6$ second. The MOSFET 10 is supplied by a current source 26 which provides substantially equal currents to the dual MOSFET pair. The resistor 28 which is connected in parallel to the drain resistor 30 is utilized to balance the current through the MOSFET pair 10.

A radiation resistant [up to $5 \times 1.0^8$ rads (Si)/sec for $3 \times 10^{-8}$ sec, $10^4$ rads (Si), and $p \times 10^2 n/cm^2$ (1MEV equiv)] signal retaining analog integration function is realized by using a low leakage such as Component Research's metalized polycarbonate, teflon, or kapton for capacitor 14 in the feedback loop of a high input impedance operational amplifier 12 (Op Amp). The high Op Amp input impedance is achieved using a tightly matched MOSFET pair. The total dose resistance is the result of using MOSFETS which have extremely pure $SiO_2$ gate regions, such as Hughes' HDIG8551 to LDIG9551 and the low leakage capacitor. The resistance to radiation rate is the result of the MOSFET input, low leakage relatively large feedback capacitor (0.5uf or larger) and reed relay input. In addition to providing the radiation rate resistance, the present circuit provides initial condition protection in the event of a loss of the DC bias voltages shown. With the above components, a radiation environment of 1 MEV neutrons (up to $2 \times 10^{12}$ n/cm$^2$) have little effect upon the circuit. The MOSFET is biased by a constant current source to provide zero temperature compensation operation.

Figure 2:
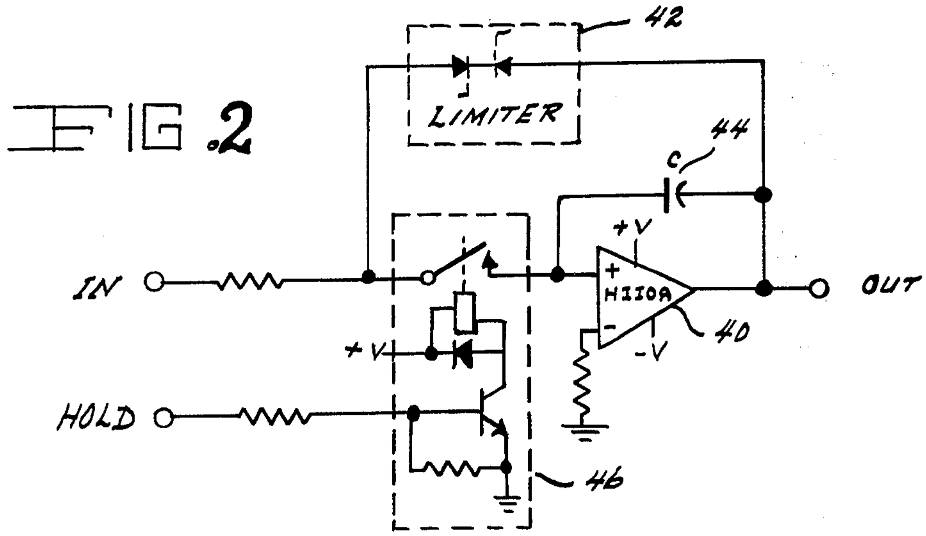
FIG. 2 is a schematic diagram of the circuit of FIG. 1 including a limiter circuit to prevent the storing of twice the power supply voltage on the feedback capacitor.

Turning now to FIG. 2, there is shown a high input impedance operational amplifier 40 which is comprised of a MOSFET pair and an operational amplifier in the same circuit configuration as shown in FIG. 1. The circuit of FIG. 2 differs from FIG. 1 in that a limited circuit 42 is connected between the input of the signal retaining integrator circuit and the output. The limiter circuit is included to prevent the possibility of storing twice the supply voltage on the feedback capacitor 44. The limiter circuit 42 is placed around the capacitor 44 so that the performance of the circuit in the hold mode is not degraded. The relay circuit 46 is essentially the same relay circuit as shown in FIG. 1. The circuit operation of FIG. 2 is substantially the same as the circuit operation of FIG. 1, but with the addition of the limiter circuit 42. FIG. 2 is merely a modification of the circuit of FIG. 1. FIG 2 may be further modified by replacing the relay circuit 46 with a solid state switch circuit. In addition, either circuit in FIG. 1 or FIG. 2 may be modified by providing a precision current source to supply the current to the MOSFET.

Although the invention has been described with reference to a particular embodiment, it will be understood to those skilled in the art that the invention is capable of a variety of alternative embodiments within the spirit and scope of the appended claims.

What is claimed is:

1. A D.C. biased signal retaining analog integrator apparatus comprising in combination:

a high input impedance integrator means to receive an input signal, said high input impedance integrater means integrating said input signal to provide an output signal, a current source connected to said high input impedance integrator means to supply a constant current to said high input impedance integrator means, and, a control means connected to said high input impedance integrator means, said control means controlling the input to said high input impedance integrator means to provide a hold function for the output signal within said high input impedance integrator means, said control means receiving a hold signal, said control means being responsive to said hold signal, said control means disconnecting said input signal from said high input impedance integrator means in response to said hold signal, said control means controlling said high input impedance integrator means to retain said output signal in response to said hold signal, said high input impedance integrator means maintaining said output signal during loss of the DC bias voltages.

2. A signal retaining analog integrator apparatus as described in claim 1 wherein said high input impedance integrator means comprises in combination:

an integrator means for receiving an input signal and providing an output signal, said output signal being the integrated input signal, and means for providing a high input impedance connected to said integrator means.

3. A signal retaining analog integrator apparatus as described in claim 2 wherein said high input impedance means comprises a differential amplifier with its outputs connected to said integrator means, said differential amplifier having first and second input terminals, said first input terminal receiving said input signal, said second input terminal being negatively biased.

4. A signal retaining analog integrator apparatus as described in claim 3 wherein said differential amplifier comprises a matched dual pair MOSFET.

5. A signal retaining analog integrator apparatus as described in claim 3 wherein said integrator means comprises an operational amplifier with a low leakage capacitor connected between the operational amplifier output and said first input terminal of said differential amplifier, said operational amplifier having first and second input terminals respectively connected to said differential amplifier outputs.

6. A signal retaining analog integrator apparatus as described in claim 1 wherein said holding means comprises in combination:

a relay unit connected to said high input impedance integrator means to switch said input signal in and out of said high input impedance integrator means upon command of a hold signal, and a switching circuit connected to said relay unit to control said relay unit operation, said switching circuit receiving a hold signal, said switching circuit de-energizing said relay unit upon command of a hold signal.

7. A signal retaining analog integrator apparatus as described in claim 1 further including a limiter means connected between said high input impedance integrator means output and input.

8. A signal retaining analog integrator apparatus as described in claim 7 wherein said limiter means comprises a pair of zener diodes back to back.

* * * * *